US012627291B2

(12) United States Patent
Chen et al.

(10) Patent No.: US 12,627,291 B2
(45) Date of Patent: May 12, 2026

(54) ELECTRONIC DEVICE AND ITS TEMPERATURE DETECTION DEVICE

(71) Applicant: LEAP Semiconductor Corp., Taoyuan City (TW)

(72) Inventors: Wei-Fan Chen, Taichung City (TW); Kuo-Chi Tsai, Taoyuan City (TW)

(73) Assignee: LEAP Semiconductor Corp., Taoyuan City (TW)

( * ) Notice: Subject to any disclaimer, the term of this patent is extended or adjusted under 35 U.S.C. 154(b) by 836 days.

(21) Appl. No.: 18/070,400

(22) Filed: Nov. 28, 2022

(65) Prior Publication Data

US 2024/0106428 A1 Mar. 28, 2024

(30) Foreign Application Priority Data

Sep. 27, 2022 (TW) .................................. 111136452

(51) Int. Cl.
*H03K 17/14* (2006.01)
*G01K 7/01* (2006.01)
(Continued)

(52) U.S. Cl.
CPC ..... *H03K 17/145* (2013.01); *H03K 17/08122* (2013.01); *G01K 7/01* (2013.01);
(Continued)

(58) Field of Classification Search
CPC .......... H02H 5/042; H02H 3/085; G01K 7/01; H03K 17/145; H03K 2017/0806
See application file for complete search history.

(56) References Cited

U.S. PATENT DOCUMENTS 6,046,470 A 4/2000 Williams et al.
7,368,784 B2 5/2008 Botti et al.
(Continued)

FOREIGN PATENT DOCUMENTS

CN 107014507 8/2017
JP 2007315836 12/2007
TW 201525428 7/2015

OTHER PUBLICATIONS

Giovanni Pangallo et al., "Use of Body-Diode for Thermal Monitoring of Power MOSFET", SensorDevices 2018 : The Ninth International Conference on Sensor Device Technologies and Applications, Sep. 16, 2018, pp. 132-135.
(Continued)

*Primary Examiner* — Thienvu V Tran
(74) *Attorney, Agent, or Firm* — JCIPRNET

(57) ABSTRACT

An electronic device and a temperature detection device thereof are provided. The temperature detection device includes a first resistor, a second resistor, and an operation circuit. The first resistor and the second resistor are coupled in series between a detection end and a first voltage. The first resistor and the second resistor divide a detection voltage on the detection end to generate a monitoring voltage. The operation circuit compares the monitoring voltage with a plurality of reference voltages to generate a plurality of comparison results. The operation circuit performs an operation on the comparison results to generate detection temperature information. The first resistor is a poly-silicon resistor and the second resistor is a silicon carbon (SiC) diffusion resistor.

18 Claims, 9 Drawing Sheets

(51) Int. Cl.

| | |
|---|---|
| *H02H 3/08* | (2006.01) |
| *H02H 5/04* | (2006.01) |
| *H03K 17/0812* | (2006.01) |
| *H03K 17/08* | (2006.01) |

(52) U.S. Cl.
CPC ............. *H02H 3/085* (2013.01); *H02H 5/042* (2013.01); *H03K 2017/0806* (2013.01)

(56) References Cited

U.S. PATENT DOCUMENTS

| | | | | |
|---|---|---|---|---|
| 10,444,081 | B2 * | 10/2019 | Horng | ..................... G01K 7/01 |
| 10,833,668 | B2 | 11/2020 | Lai et al. | |
| 2012/0007908 | A1 | 1/2012 | Masuda | |
| 2013/0153900 | A1 | 6/2013 | Kinouchi et al. | |
| 2014/0368264 | A1 * | 12/2014 | Horng | ............... G01R 19/0084 |
| | | | | 327/536 |
| 2019/0107856 | A1 * | 4/2019 | Lim | ......................... G05F 1/59 |

OTHER PUBLICATIONS

D. M. Nguyen et al., "Comparison of Electrical Properties of Ohmic Contact Realized on p-type 4H—SiC", Materials Science Forum vols. 600-603, Sep. 26, 2008, pp. 1-5.

Maxime Berthou et al., "Monolithically Integrated Temperature Sensor in Silicon Carbide Power MOSFETs", IEEE Transactions on Power Electronics, vol. 29, No. 9, Nov. 7, 2013, pp. 4970-4977.

M. A. Capano et al., "Ionization energies and electron mobilities in phosphorus- and nitrogen-implanted 4H-silicon carbide", Journal of Applied Physics, vol. 87, No. 12, Jun. 15, 2000, pp. 1-6.

Manjula S. Raman et al., "Physical Model for the Resistivity and Temperature Coefficient of Resistivity in Heavily Doped Polysilicon", IEEE Transactions on Electron Devices, vol. 53, No. 8, Jul. 24, 2006, pp. 1885-1892.

Xiao-Yu Tang et al, "Characteristics and Breakdown Behaviors of Polysilicon Resistors for High Voltage Applications", Advances in Condensed Matter Physics, vol. 2015, Article ID 423074, Apr. 27, 2015, pp. 1-5.

"Office Action of Taiwan Counterpart Application", issued on Oct. 23, 2023, p. 1-p. 5.

* cited by examiner

501

502

ELECTRONIC DEVICE AND ITS TEMPERATURE DETECTION DEVICE

CROSS-REFERENCE TO RELATED APPLICATION

This application claims the priority benefit of Taiwan application serial no. 111136452, filed on Sep. 27, 2022. The entirety of the above-mentioned patent application is hereby incorporated by reference herein and made a part of this specification.

BACKGROUND

Technical Field

The disclosure relates to an electronic device and a temperature detection device thereof, and more particularly, to a fast-response electronic device and a temperature detection device thereof.

Related Art

Power transistors are often operated in high-temperature environments and are therefore particularly sensitive to the upper operating limits of temperature. When transition occurs in a power transistor operating in an environment at the upper limit of temperature, the transistor is likely to be damaged.

Based on the above, ambient temperature detection is important for the operation of the power transistor. The key point is whether a response speed of a temperature detection circuit for temperature detection is sufficiently fast to protect the power transistor from damage. However, if the temperature detection circuit is designed to be excessively sensitive, it may cause incorrect operation of the temperature detection operation and erroneously turn off the power transistor. Therefore, how to design a temperature detection circuit that is capable of correctly determination and can quickly respond to over-temperature is a topic for those skilled in the art.

SUMMARY

The disclosure provides an electronic device and a temperature detection device, which are capable of quickly detecting the temperature.

The temperature detection device according to the disclosure includes a first resistor, a second resistor, and an operation circuit. The first resistor and the second resistor are coupled in series between a detection end and a first voltage. The first resistor and the second resistor divide a detection voltage on the detection end so as to generate a monitoring voltage. The operation circuit is coupled to the first resistor and the second resistor, and compares the monitoring voltage with a plurality of reference voltages so as to generate a plurality of comparison results. The operation circuit performs an operation on the comparison results so as to generate a detection temperature information. The first resistor is a poly-silicon resistor, and the second resistor is a silicon carbon diffusion resistor.

The electronic device according to the disclosure includes a power transistor and the temperature detection device. The power transistor is coupled to the temperature detection device. A first end of the power transistor receives an operation power, and a control end of the power transistor is coupled to the detection end.

Based on the above, the temperature detection device according to the disclosure divides the detection voltage on the detection end through the first resistor, which is a poly-silicon resistor, and the second resistor, which is a silicon carbon diffusion resistor so as to generate the monitoring voltage, and then compares the monitoring voltage with a plurality of different reference voltages through an operation circuit. By determining the voltage range in which the monitoring voltage is in, the temperature detection device can quickly detect the level of temperature on the detection end, and provide it to the electronic device to perform corresponding operations.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
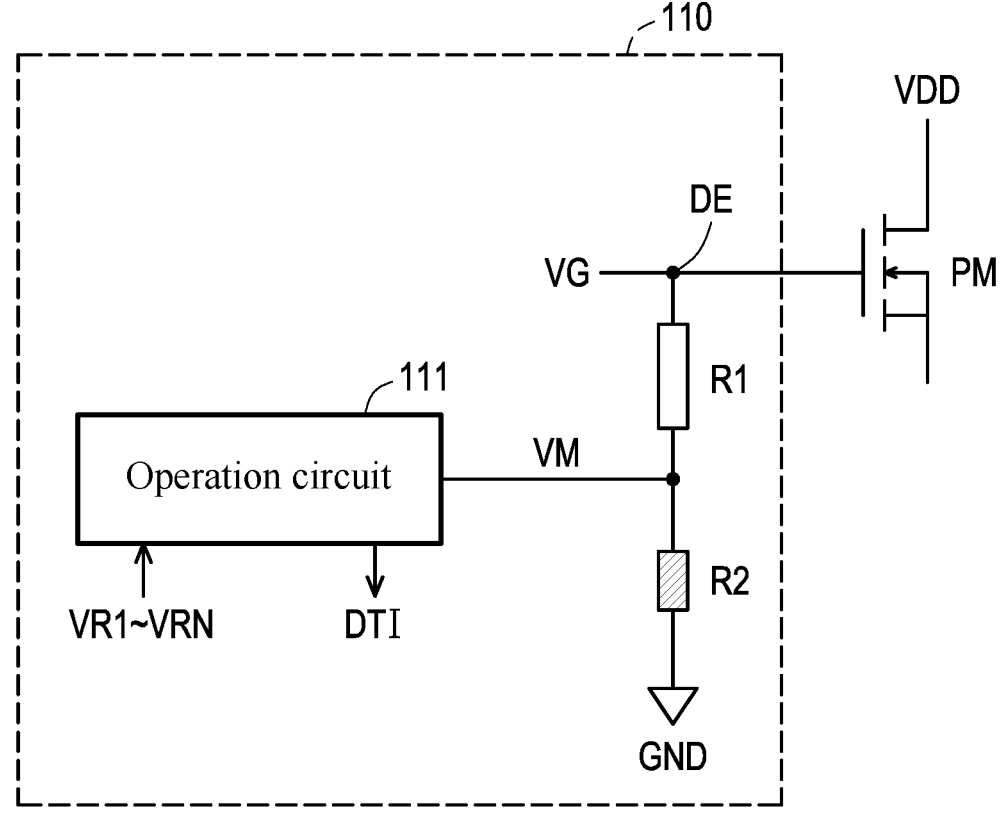
FIG. 1 is a schematic diagram of an electronic device according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Please refer to FIG. 1, which is a schematic diagram of an electronic device according to an embodiment of the disclosure. An electronic device 100 includes a temperature detection device 110 and a power transistor PM. The temperature detection device 110 is coupled to a control end of the power transistor PM. One end of the power transistor PM receives an operating power VDD, and the other end of the power transistor PM may provide the operating power VDD to a load circuit.

The temperature detection device 110 includes an operation circuit 111, a first resistor R1, and a second resistor R2. One end of the first resistor R1 is coupled to a detection end DE and receives a detection voltage VG on the detection end DE, in which the detection end DE is coupled to the control end of the power transistor PM. The other end of the first resistor R1 is coupled to the operation circuit 111 and is coupled to a first end of the second resistor R2, and a second end of the second resistor R2 receives a reference ground voltage GND. The first resistor R1 and the second resistor R2 form a voltage-divider circuit for dividing a voltage difference between the detection voltage VG and the reference ground voltage GND, thereby generating a monitoring voltage VM. In this embodiment, the reference ground voltage GND may be 0 volts. On the other hand, the operation circuit 111 may receive the monitoring voltage VM, compare the monitoring voltage VM with a plurality of reference voltages VR1~VRN, and generate a plurality of comparison results respectively. Moreover, the operation circuit 111 performs an operation on the comparison results to generate detection temperature information DTI.

Figure 2:
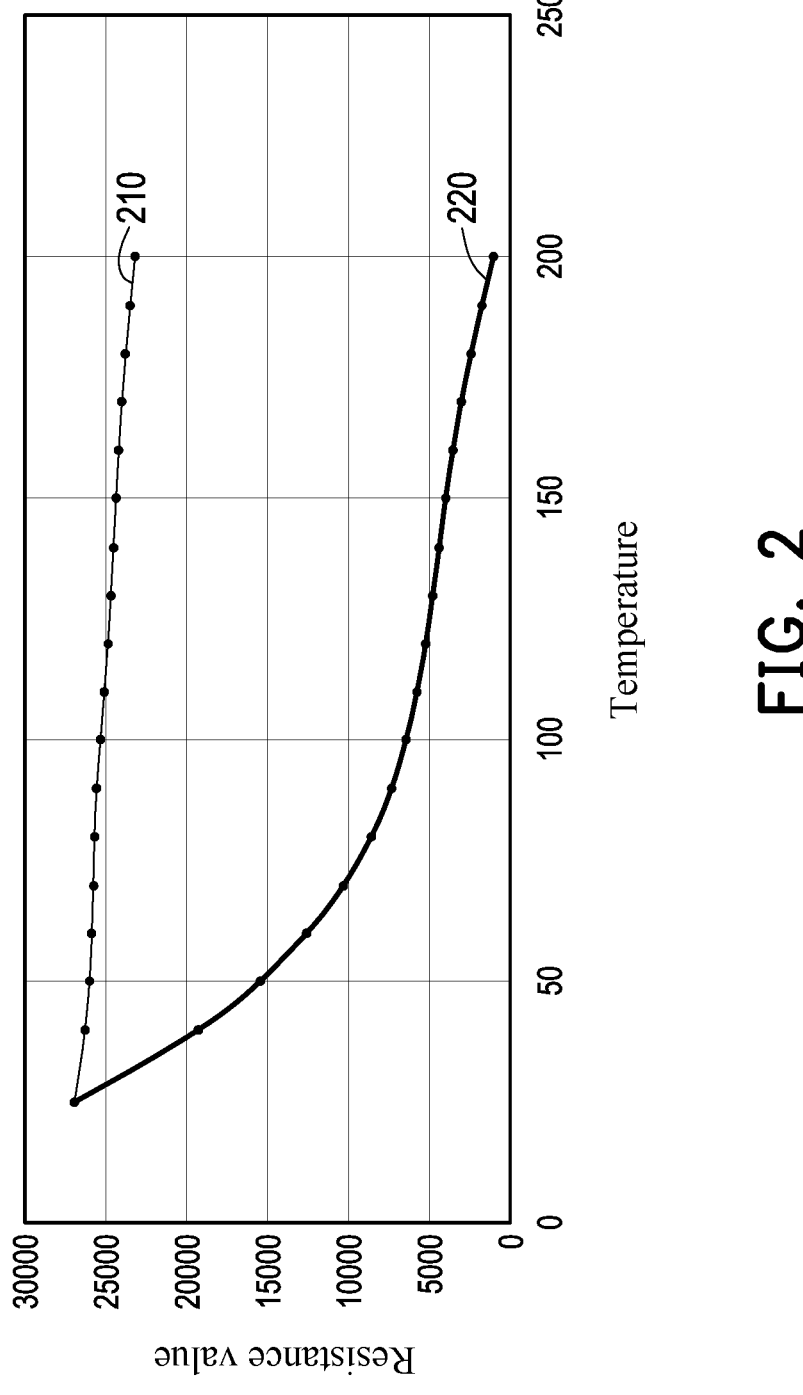
FIG. 2 is a graph illustrating relation curves between a resistance value and a temperature change of a poly-silicon resistor and a silicon carbon diffusion resistor.

It is worth mentioning that, in the embodiments of the disclosure, the first resistor R1 may be a poly-silicon resistor, and the second resistor R2 may be a silicon carbon diffusion resistor. Please refer to FIG. 2 at the same time. FIG. 2 is a graph illustrating relation curves between a resistance value and a temperature change of the poly-silicon resistor and the silicon carbon diffusion resistor. A curve 210 is the relation curve between the resistance value and the temperature change of the first resistor R1 (poly-silicon resistor), and a curve 220 is the relation curve between the resistance value and the temperature change of the second resistor R2 (silicon carbon diffusion resistor). It may be found from FIG. 2 that the resistance value of the first resistor R1 is not highly sensitive to temperature changes. Also, in a certain temperature change range, the variation rate of the resistance value of the first resistor R1 is relatively low. In contrast, the resistance value of the second resistor R2 is highly sensitive to temperature changes. Also, in a certain temperature variation range, the variation rate of the resistance value of the first resistor R1 is relatively high.

Referring to FIG. 1 again. According to the curves 210 and 220 in FIG. 2, it may be known that when the temperature changes, a voltage dividing ratio of the voltage-divider circuit formed by the first resistor R1 and the second resistor R2 will change according to the large change in the resistance value of the second resistor R2. In other words, the monitoring voltage VM generated by the first resistor R1 and the second resistor R2 may be changed in association with the change in temperature.

To further illustrate, the operation circuit 111 may receive the plurality of preset reference voltages VR1~VRN. The reference voltages VR1~VRN may be set based on the variation rate generated by the monitoring voltage VM according to the temperature range to be detected. Moreover, the reference voltages VR1~VRN may correspond to a plurality of temperatures, respectively. Specifically, taking the reference voltage VR1 corresponding to a temperature T1 as an example, at the temperature T1, the voltage dividing ratio formed by the resistance values of the first resistor R1 and the second resistor R2 may just divide the detection voltage VG to generate the monitoring voltage VM equal to the reference voltage VR1. If the reference voltage VRN corresponds to a temperature TN, it means that at the temperature TN, the voltage dividing ratio formed by the resistance values of the first resistor R1 and the second resistor R2 may just divide the detection voltage VG to generate the monitoring voltage VM equal to the reference voltage VRN.

Based on the above, the operation circuit 111 may compare each of the reference voltages VR1~VRN with the monitoring voltage VM, calculating which two of the reference voltages VR1~VRN the monitoring voltage VM falls between or which of the reference voltages VR1~VRN the monitoring voltage VM is equal to, thereby obtaining detection temperature information for representing a current temperature.

In detail, the operation circuit 111 may compare each of the reference voltages VR1~VRN with the monitoring voltage VM to generate comparison results of a plurality of digital values. Taking the reference voltage VR1 as an example, when a corresponding comparison result is a first logic value, it may indicate that the monitoring voltage VM is higher than the reference voltage VR1; when a corresponding comparison result is a second logic value, it may indicate that the monitoring voltage VM is not higher than the reference voltage VR1. The first logic value may be logic 0 (or logic 1), and the second logic value may be logic 1 (or logic 0).

The operation circuit 111 may further perform operations on the plurality of comparison results. Specifically, if the reference voltage includes the reference voltage VR1 to the reference voltage VRN in order of magnitude, the operation circuit 111 may generate a first comparison result to an N-th comparison result corresponding to the reference voltage VR1 to the reference voltage VRN respectively. The operation circuit 111 may compare an i-th comparison result and an i+1-th comparison result (by exclusive OR operation), and thereby generating an i-th bit of the detection temperature information. N is a positive integer larger than 1, and i is a positive integer larger than 0 and smaller than N.

Figure 3:
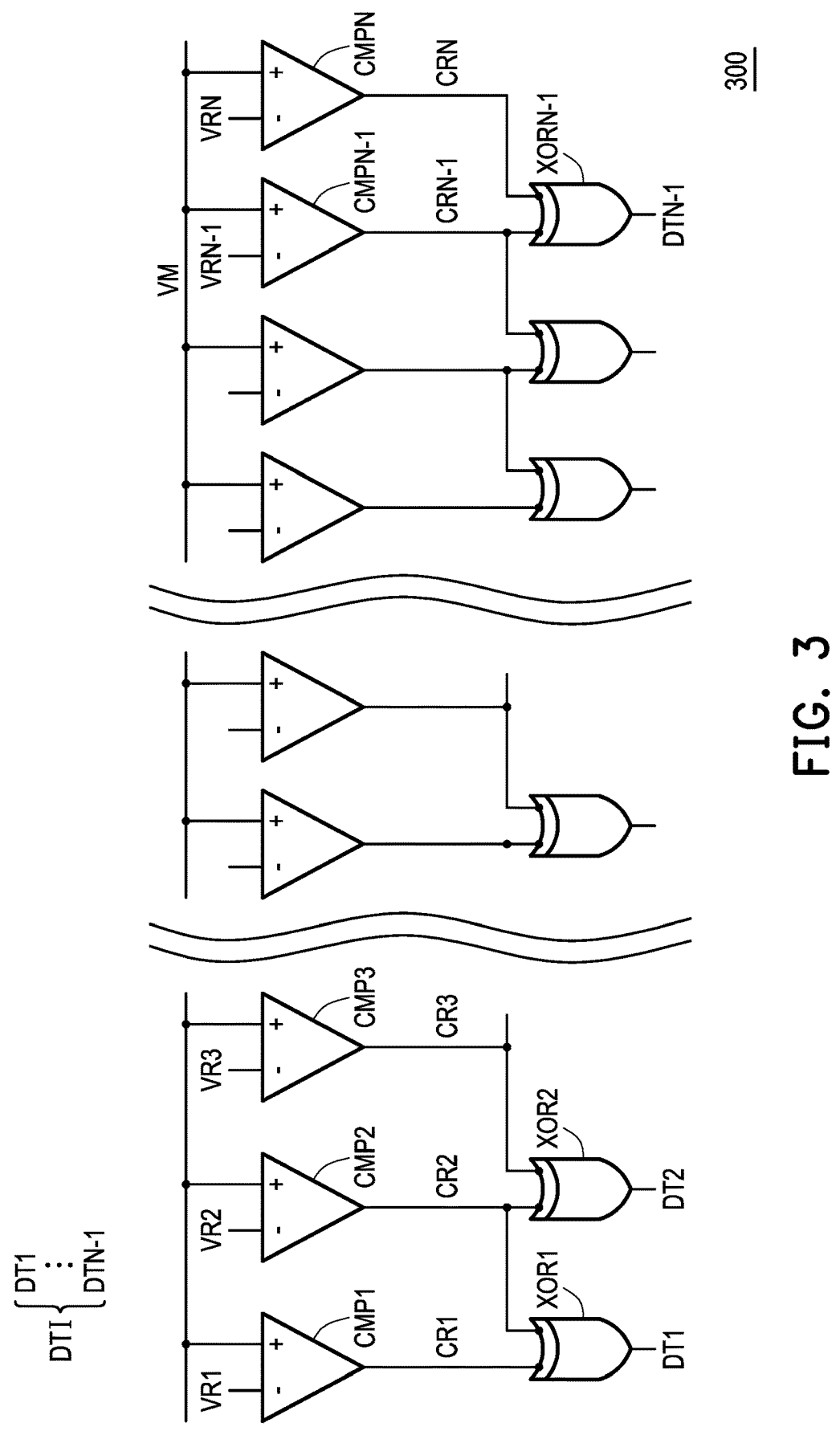
FIG. 3 is a schematic diagram illustrating an implementation of an operation circuit in a temperature detection device according to an embodiment of the disclosure.

Please refer to FIG. 3 below. FIG. 3 is a schematic diagram illustrating an implementation of an operation circuit in a temperature detection device according to an embodiment of the disclosure. An operation circuit 300 includes comparators CMP1~CMPN and exclusive OR gates XOR1~XORN–1. Negative input ends of the comparators CMP1~CMPN receive the reference voltages VR1~VRN respectively, positive input ends of the comparators CMP1~CMPN jointly receive the monitoring voltage VM, and the comparators CMP1~CMPN1 generate comparison results CR1~CRN respectively. The comparators CMP1~CMPN compare the monitoring voltage VM with the reference voltages VR1~VRN, and thereby obtaining a voltage range in which the monitoring voltage VM is in. For example, when the monitoring voltage VM is higher than a reference voltage VR2 and lower than a reference voltage VR3, the comparators CMP1 and CMP2 may generate the comparison results CR1 and CR2 that are equal to logic 1, and the comparators CMP3~CMPN may respectively generate the comparison results CR3~CRN that are equal to logic 0.

Each of the exclusive OR gates XOR1~XORN–1 receives two of the comparison results CR1~CRN, and the exclusive OR gates XOR1~XORN–1 respectively generate a plurality of bits DT1~DTN–1 of the detection temperature information DTI. Corresponding to the reference voltages VR1~VRN that are in order, each of the exclusive OR gates XOR1~XORN–1 may receive two adjacent comparison results. For example, the exclusive OR gate XOR1 may receive the comparison results CR1 and CR2, the exclusive OR gate XOR2 may receive the comparison results CR2 and CR3, and the rest may be derived by analogy. Each of the exclusive OR gates XOR1~XORN–1 is configured to determine whether the received two comparison results are the same so as to generate the detection temperature information DTI. For the exclusive OR gate that determines the received two comparison results are different, the bit (for example, equal to logic 1) of the detection temperature information DTI generated may indicate a range in which the current temperature is in.

In other embodiments of the disclosure, the exclusive OR gates XOR1~XORN−1 may be replaced by XNOR gates.

Figure 4:
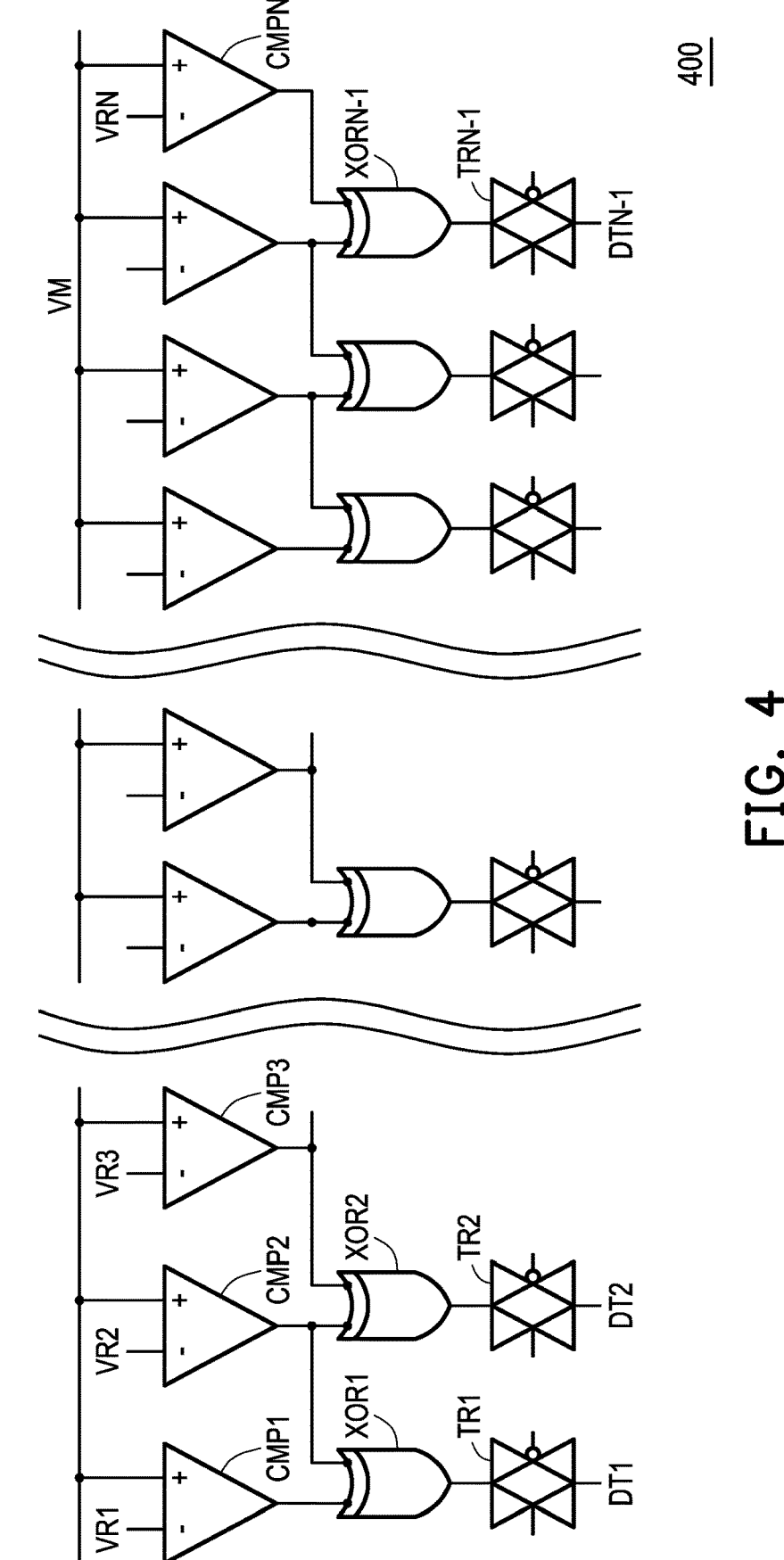
FIG. 4 is a schematic diagram illustrating another implementation of an operation circuit in the temperature detection device according to an embodiment of the disclosure.

Please refer to FIG. 4 below. FIG. 4 is a schematic diagram illustrating another implementation of the operation circuit in the temperature detection device according to the embodiment of the disclosure. An operation circuit 400 includes the comparators CMP1~CMPN, the exclusive OR gates XOR1~XORN−1, and transmission switches TR1~TRN−1. Different from the embodiment shown in FIG. 3, the operation circuit 400 further includes the transmission switches TR1~TRN−1. The transmission switches TR1~TRN−1 are respectively coupled to output ends of the exclusive OR gates XOR1~XORN−1. The transmission switches TR1~TRN−1 may synchronously output the plurality of bits DT1~DTN−1 of the detection temperature information DTI at a same time point according to a control signal. Alternatively, the transmission switches TR1~TRN−1 may also sequentially output the plurality of bits DT1~DTN−1 of the detection temperature information DTI at different time points according to the control signal.

In this embodiment, the transmission switches TR1~TRN−1 may be implemented by using transmission gates of logic circuits, or implemented by using any semiconductor switching elements known to those skilled in the art, without specific limitations.

Figure 5A:
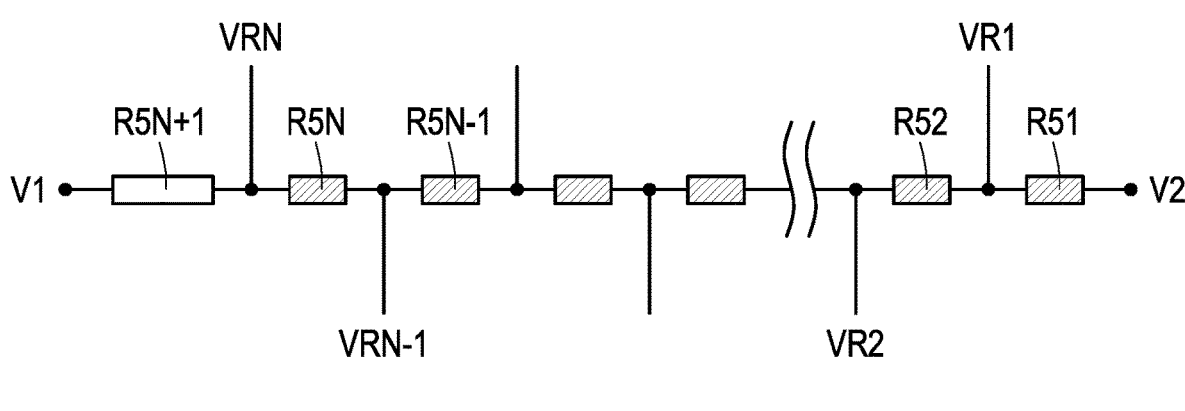
FIGS. 5A and 5B are schematic diagrams illustrating different implementations of a reference voltage generator in a temperature detection device according to an embodiment of the disclosure.
Figure 5B:
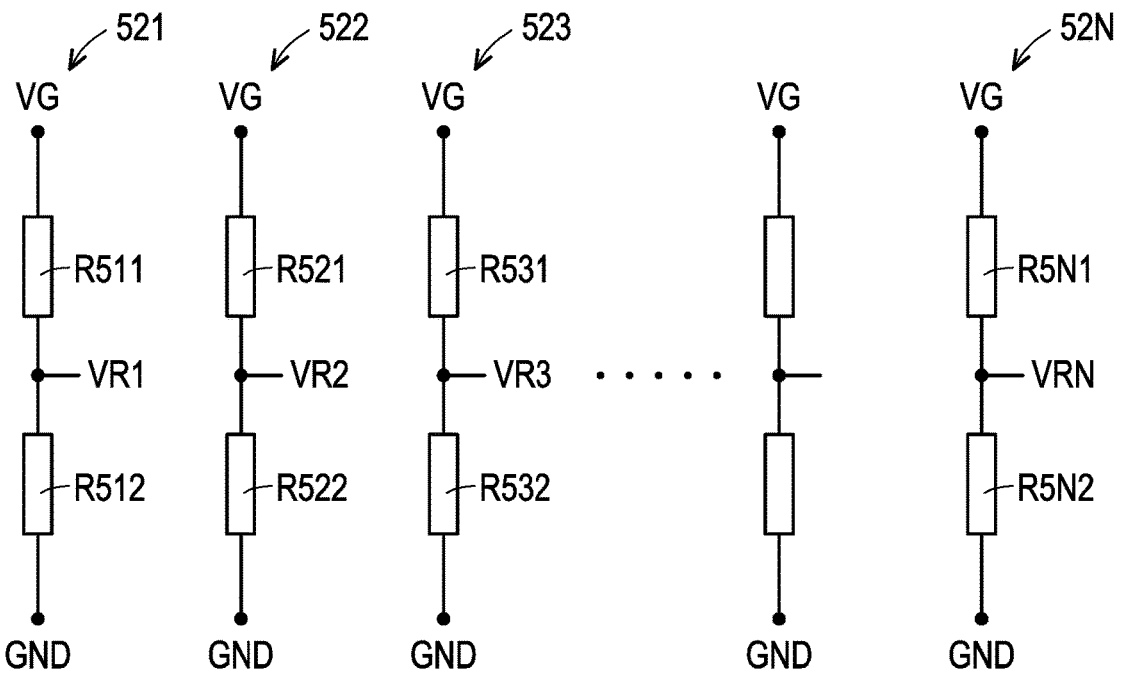

Please refer to FIGS. 5A and 5B below. FIGS. 5A and 5B are schematic diagrams illustrating different implementations of a reference voltage generator in the temperature detection device according to the embodiment of the disclosure. In the embodiment of the disclosure, the reference voltage received by the operation circuit may be generated by a reference voltage generator. In FIG. 5A, a reference voltage generator 501 includes a plurality of resistors R51~R5N+1. The resistors R51~R5N+1 are connected in series with each other to form a voltage-divider circuit. The voltage-divider circuit formed by the resistors R51~R5N+1 has one end receiving a voltage V1, and the other end receiving a voltage V2. Taking the voltage V1 higher than the voltage V2 as an example, the resistors R51~R5N+1 may divide a voltage difference between the voltage V1 and the voltage V2 to generate a plurality of reference voltages VR1~VRN.

In this embodiment, the voltage V1 may be equal to the detection voltage VG in the embodiment of FIG. 1. The voltage V2 may be a reference ground voltage (e.g. 0 volts).

It is worth mentioning that, in order to prevent the reference voltages VR1~VRN from being changed by temperature changes, the resistors R51~R5N+1 may be constructed by using poly-silicon resistors that are less sensitive to temperature changes. In this embodiment, resistance values of the resistors R51~R5N may be the same, while resistance value of the resistor R5N+1 may be different from the resistance values of the resistors R51~R5N. For example, the resistance value of the resistor R5N+1 may be higher than resistance value of the resistor R51.

In FIG. 5B, a reference voltage generator 502 includes a plurality of voltage-divider circuits 521~52N. Each of the voltage-divider circuits 521~52N is coupled between the detection voltage VG and the reference ground voltage GND. The voltage-divider circuit 521 includes resistors R511 and R512 coupled in series; the voltage-divider circuit 522 includes resistors R521 and R522 coupled in series; the voltage-divider circuit 523 includes resistors R531 and R532 coupled in series; . . . ; and the voltage-divider circuit 52N includes resistors R5N1 and R5N2 coupled in series. The voltage-divider circuits 521~52N respectively generate the reference voltages VR1~VRN by dividing the detection voltage VG. It is worth mentioning that, in order to prevent the reference voltages VR1~VRN from being changed by temperature changes, the resistors R511~R5N2 may be constructed by using poly-silicon resistors that are less sensitive to temperature changes.

Here, the number of the reference voltages VR1~VRN may be set according to a resolution of the detection temperature information in the temperature detection operation. The designer may adjust the number of the reference voltages VR1~VRN according to the required resolution of the detection temperature information, and there is no fixed limit.

Figure 6:
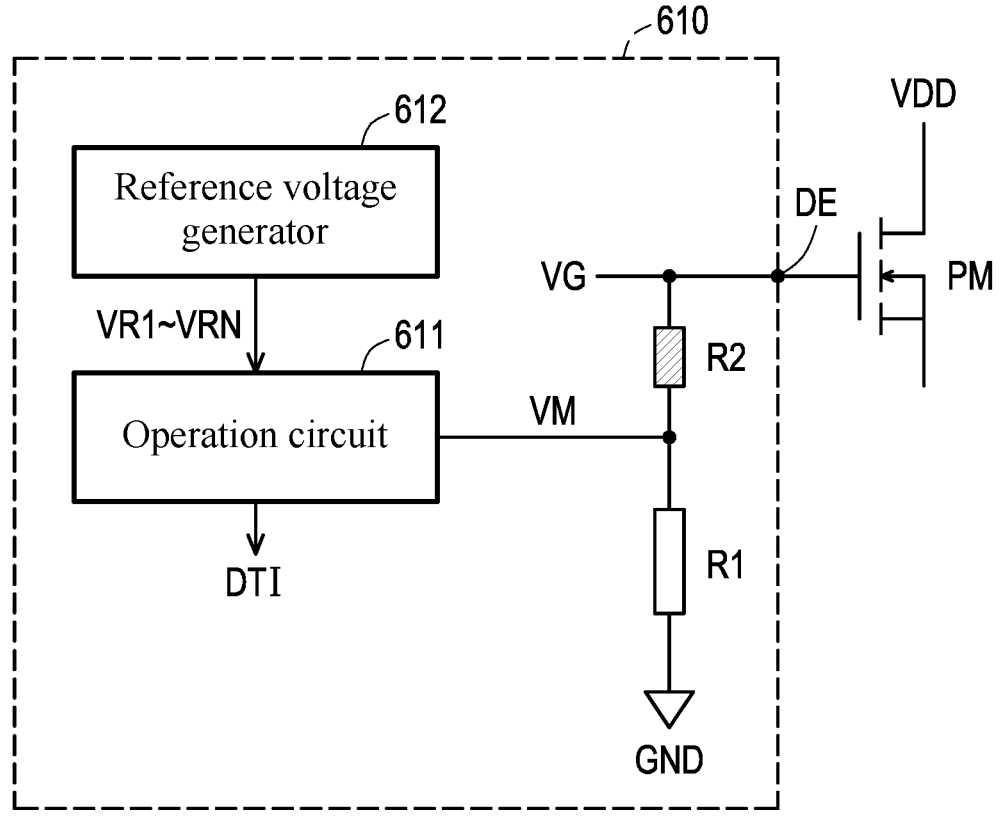
FIG. 6 is a schematic diagram of an electronic device according to another embodiment of the disclosure.

Please refer to FIG. 6 below. FIG. 6 is a schematic diagram of an electronic device according to another embodiment of the disclosure. An electronic device 600 includes a temperature detection device 610 and the power transistor PM. The temperature detection device 610 is coupled to the control end of the power transistor PM. The temperature detection device 610 includes the first resistor R1, the second resistor R2, an operation circuit 611, and a reference voltage generator 612. The second resistor R2 and the first resistor R1 are connected in series to form a voltage-divider circuit for dividing the detection voltage VG so as to generate the monitoring voltage VM. The first end of the second resistor R2 is coupled to the detection end DE, in which the detection end DE may be the control end of the power transistor PM. The temperature detection device 610 includes the operation circuit 611 and the reference voltage generator 612. The operation circuit 611 and the reference voltage generator 612 are coupled to each other. The reference voltage generator 612 is configured to provide the reference voltages VR1~VRN to the operation circuit 611. The operation circuit 611 receives the monitoring voltage VM and compares the monitoring voltage VM with each of the reference voltages VR1~VRN, thereby generating the detection temperature information DTI.

The implementation details of the operation circuit 611 and the reference voltage generator 612 have been described in detail in the foregoing embodiments and implementations, and will not be repeated here.

Different from the previous embodiment, in this embodiment, the first resistor R1, which is a poly-silicon resistor, is coupled to the lower end of the second resistor R2, which is a silicon carbon diffusion resistor. In other words, in the embodiment of the disclosure, the coupling order of the first resistor R1 and the second resistor R2 is not limited.

Incidentally, the second resistor R2 may be an N-type silicon carbon diffusion resistor, or may also be a P-type silicon carbon diffusion resistor; the disclosure is not limited thereto.

Figure 7A:
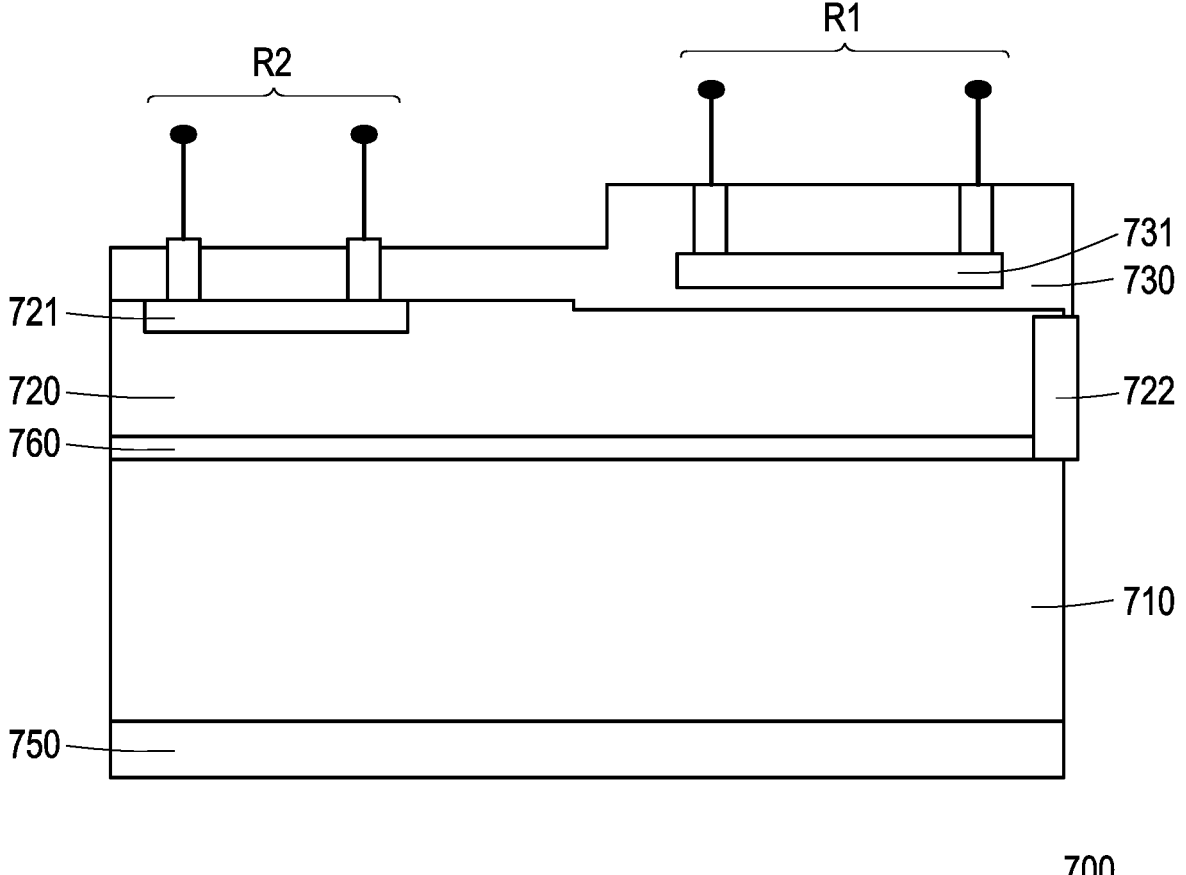
FIG. 7A is a structural diagram of a first resistor and a second resistor in a temperature detection device according to an embodiment of the disclosure.
Figure 7B:
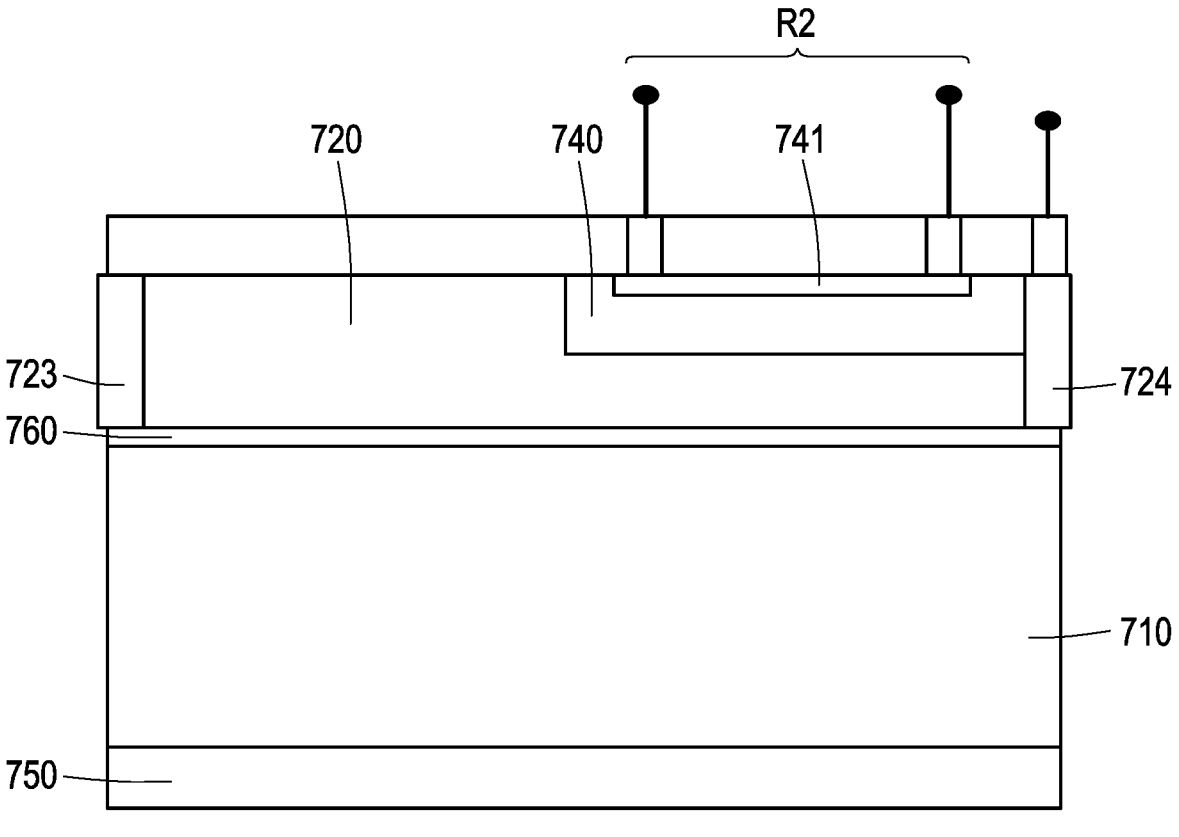
FIG. 7B is a structural diagram of another embodiment of a second resistor in a temperature detection device according to an embodiment of the disclosure.

Please refer to FIG. 7A and FIG. 7B. FIG. 7A is a structural diagram of the first resistor and the second resistor in the temperature detection device according to the embodiment of the disclosure, and FIG. 7B is a structural diagram of another embodiment of the second resistor in the temperature detection device according to the embodiment of the disclosure. In FIG. 7A, the first resistor R1 and the second resistor R2 may be disposed in a same integrated circuit 700. The integrated circuit 700 includes a drift region 710, a drift region 720, an insulating layer 730, a heavily doped layer 750 and a doped layer 760. The drift region 720 may be formed on the drift region 710 with the doped layer

760 between the drift region 720 and the drift region 710. Conductivity type of the doped region 760 is opposite to that of the drift region 720 and the drift region 710. The insulating layer 730 may cover the drift region 720. The first resistor R1 may be formed of a poly-silicon layer 731 and disposed in the insulating layer 730. Moreover, the second resistor R2 may be formed of a P-type silicon carbon diffusion layer 721 and disposed in the drift region 720. Moreover, the heavily doped layer 750 may be disposed under the drift region 710. The drift region 710 is, for example, an N-type drift region, and the heavily doped layer 750 may be an N+type heavily doped layer.

On the other hand, the drift region 720 may have a buried well region 722 therein to provide a potential contact.

Moreover, the drift region 720 may have buried-type well regions 723 and 724 therein to provide a plurality of potential contacts.

In FIG. 7B, when the second resistor R2 is an N-type silicon carbon diffusion resistor, the integrated circuit 700 may further have a P-type well region 740. The P-type well region 740 is disposed in the drift region 720. The second resistor R2 may be composed of an N-type silicon carbon diffusion layer 741, in which the N-type silicon carbon diffusion layer 741 may be formed in the P-type well region 740.

Figure 8:
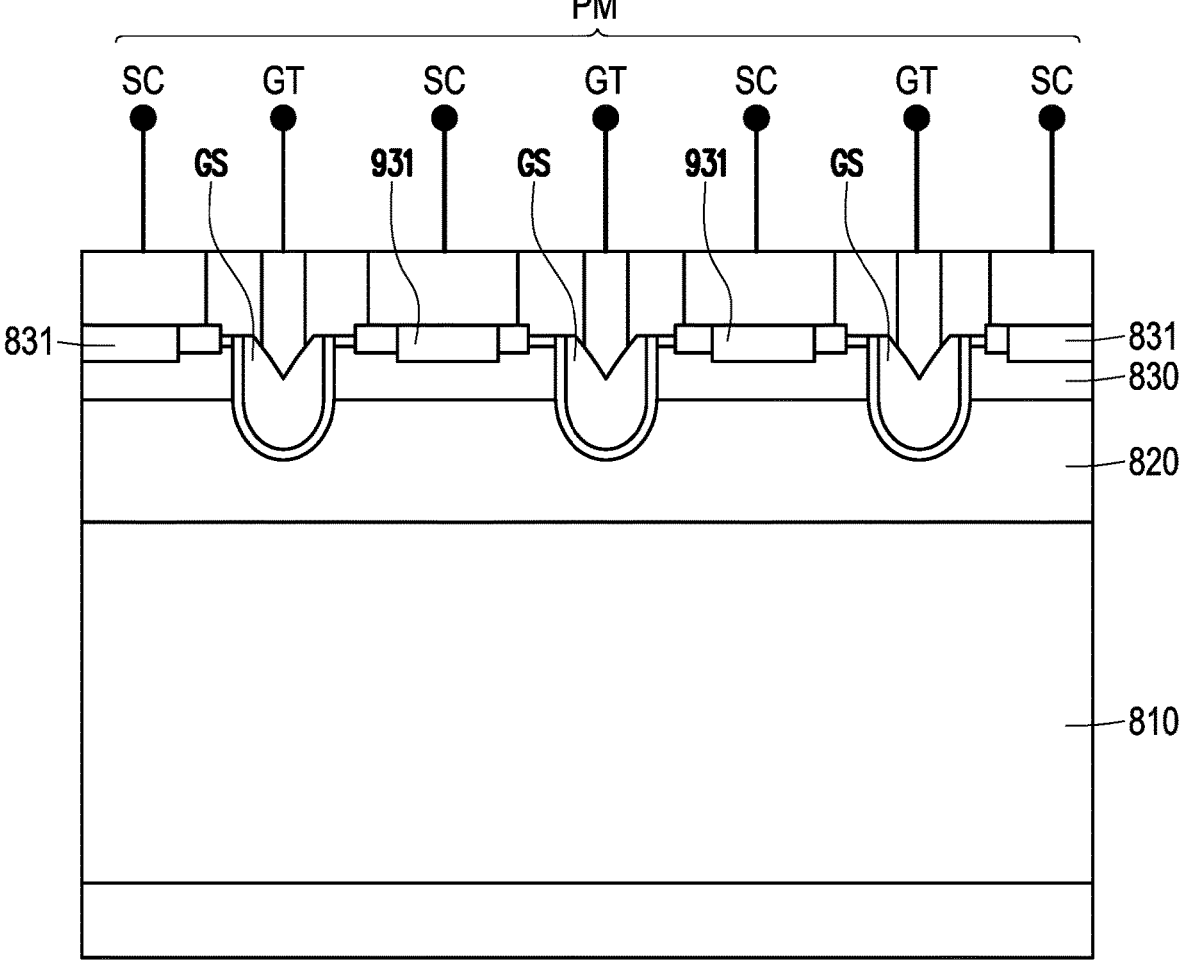
FIG. 8 is a schematic structural diagram of a power transistor in an electronic device according to an embodiment of the disclosure.

Please refer to FIG. 8. FIG. 8 is a schematic structural diagram of a power transistor in an electronic device according to an embodiment of the disclosure. The power transistor PM is formed on an integrated circuit 800. The integrated circuit 800 includes drift regions 810, 820 and a P-type well region 830. The drift region 820 is formed on the drift region 810, and the P-type well region 830 is formed on the drift region 820. A plurality of gate structures GS may be formed in the P-type well region 830 and the drift region 820, and together form a gate electrode GT of the power transistor PM. Moreover, a plurality of P-type heavily doped regions 831 are respectively formed on a plurality of regions of the P-type well region 830, and together form a source electrode SC of the power transistor PM.

Incidentally, a drain electrode of the power transistor PM may be formed on a backside of the integrated circuit 800.

Based on FIG. 7A, FIG. 7B and FIG. 8, it may be known that the power transistor PM and the first resistor R1 and the second resistor R2 for generating the monitoring voltage according to the disclosure may be integrated on the same integrated circuit. In this way, the temperature change on the integrated circuit may be quickly reflected on the monitoring voltage, and the temperature detection device can quickly detect the state of the temperature change and generate the detection temperature information.

In summary, the temperature detection device according to the disclosure uses a first resistor that is less sensitive to temperature changes and a second resistor that is less sensitive to temperature changes to form a voltage-divider circuit. The temperature detection device divides a detection voltage through a voltage-divider circuit, and then compares the monitoring voltage obtained by dividing the voltage with a plurality of reference voltages, in which the reference voltages may respectively correspond to a plurality of temperatures. By determining which two reference voltages the monitoring voltage falls between, the temperature detection device may determine the level of the current temperature, and generate detection temperature information.

It will be apparent to those skilled in the art that various modifications and variations may be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A temperature detection device, comprising:
a first resistor and a second resistor, coupled in series between a detection end and a first voltage, the first resistor and the second resistor dividing a detection voltage on the detection end so as to generate a monitoring voltage; and
an operation circuit, coupled to the first resistor and the second resistor, comparing the monitoring voltage with a plurality of reference voltages so as to generate a plurality of comparison results, and the operation circuit performing an operation on the comparison results so as to generate a detection temperature information, wherein the first resistor is a poly-silicon resistor, and the second resistor is a silicon carbon diffusion resistor.

2. The temperature detection device according to claim 1, wherein the operation circuit comprises:
a plurality of comparators, respectively receiving the reference voltages and jointly receiving the monitoring voltage, each of the comparators comparing the monitoring voltage with each of the corresponding reference voltages so as to generate each of the comparison results; and
a plurality of logic operators, wherein each of the logic operators performs a logic operation on two of the comparison results, and the logic operators respectively generate a plurality of bits of the detection temperature information.

3. The temperature detection device according to claim 2, wherein each of the logic operators is an exclusive OR gate or an XNOR gate.

4. The temperature detection device according to claim 2, wherein the reference voltages comprise a first reference voltage to an Nth reference voltage in order of magnitude, the comparators comprise a first comparator to an Nth comparator respectively corresponding to the first reference voltage to the Nth reference voltage, and the comparators respectively generate a first comparison result to an Nth comparison result,
wherein each of the logic operators receives an i-th comparison result and an i+1-th comparison result, and generates an i-th bit of the detection temperature information, wherein N is a positive integer larger than 1, and i is larger than 0 and smaller than N positive integer.

5. The temperature detection device according to claim 2, wherein the operation circuit further comprises:
a plurality of transmission switches, respectively coupled to output ends of the logic operators and outputting the bits of the detection temperature information according to a control signal.

6. The temperature detection device according to claim 5, wherein the reference voltage generator comprises:
a voltage-divider circuit, comprising a first end receiving a second voltage, the voltage-divider circuit comprising a second end receiving a third voltage, and the voltage-divider circuit generating the reference voltages by dividing a difference between the second voltage and the third voltage.

7. The temperature detection device according to claim 6, wherein the voltage-divider circuit comprises:
a plurality of third resistors, sequentially coupled in series between a second voltage and a third voltage, wherein the third resistors generate the reference voltages by dividing a difference between the second voltage and the third voltage.

8. The temperature detection device according to claim 7, wherein the third resistors are poly-silicon resistors.

9. The temperature detection device according to claim 5, wherein the reference voltage generator comprises:

a plurality of voltage-divider circuits, respectively generating the reference voltages, wherein each of the voltage-divider circuits comprises:

a third resistor and a fourth resistor, connected in series between a second voltage and a third voltage to divide a voltage difference between the second voltage and the third voltage so as to generate each of the corresponding reference voltages.

10. The temperature detection device according to claim 9, wherein the third resistor and the fourth resistor are poly-silicon resistors.

11. The temperature detection device according to claim 1, further comprising:

a reference voltage generator, coupled to the operation circuit so as to generate the reference voltages.

12. The temperature detection device according to claim 1, wherein a first end of the first resistor is coupled to the detection end, a second end of the first resistor is coupled to a first end of the second resistor, and a second end of the second resistor receives the first voltage.

13. The temperature detection device according to claim 1, wherein a first end of the second resistor is coupled to the detection end, a second end of the second resistor is coupled to a first end of the first resistor, and a second end of the first resistor receives the first voltage.

14. The temperature detection device according to claim 1, wherein the second resistor is an N-type silicon carbon diffusion resistor or a P-type silicon carbon diffusion resistor.

15. The temperature detection device according to claim 14, wherein when the second resistor is a P-type silicon carbon diffusion resistor, the second resistor comprises:

a P-type diffusion region, disposed in a drift region.

16. The temperature detection device according to claim 14, wherein when the second resistor is an N-type silicon carbon diffusion resistor, the second resistor comprises:

an N-type diffusion region, disposed in a well region, wherein the well region is disposed in a drift region.

17. An electronic device, comprising:

the temperature detection device according to claim 1; and a power transistor, coupled to the temperature detection device, wherein a first end of the power transistor receives an operation power, and a control end of the power transistor is coupled to the detection end.

18. The electronic device according to claim 17, wherein the power transistor, the first resistor, and the second resistor are disposed on a same integrated circuit.

* * * * *